US010843066B2

(12) United States Patent
Nicoli

(10) Patent No.: US 10,843,066 B2
(45) Date of Patent: Nov. 24, 2020

(54) CAPACITIVE SENSING ASSEMBLY FOR DETECTING PROXIMITY OF USER TO A CONTROLLER DEVICE

(71) Applicant: Facebook Technologies, LLC, Menlo Park, CA (US)

(72) Inventor: Raymond Louis Nicoli, Seattle, WA (US)

(73) Assignee: Facebook Technologies, LLC, Menlo Park, CA (US)

(*) Notice: Subject to any disclaimer, the term of this patent is extended or adjusted under 35 U.S.C. 154(b) by 80 days.

(21) Appl. No.: 16/020,732

(22) Filed: Jun. 27, 2018

(65) Prior Publication Data

US 2020/0001172 A1    Jan. 2, 2020

(51) Int. Cl.
| | |
|---|---|
| *A63F 13/211* | (2014.01) |
| *G02B 27/01* | (2006.01) |
| *G06F 3/01* | (2006.01) |
| *H03K 17/955* | (2006.01) |
| *G06F 3/044* | (2006.01) |
| *G01D 5/24* | (2006.01) |

(52) U.S. Cl.
CPC .............. *A63F 13/211* (2014.09); *G01D 5/24* (2013.01); *G02B 27/0172* (2013.01); *G02B 27/0176* (2013.01); *G06F 3/012* (2013.01); *G06F 3/044* (2013.01); *H03K 17/955* (2013.01); *G06F 2203/04108* (2013.01)

(58) Field of Classification Search
CPC .......... H03K 2217/960755; G05G 1/00; G06F 3/0213; G06F 1/1662
See application file for complete search history.

(56) References Cited

U.S. PATENT DOCUMENTS

| | | | | |
|---|---|---|---|---|
| 8,858,003 | B2* | 10/2014 | Porter ................... | G06F 3/0202 362/23.03 |
| 2010/0321298 | A1* | 12/2010 | Tsai ...................... | G06F 1/1662 345/168 |
| 2012/0002339 | A1* | 1/2012 | Zhang .................... | H01T 19/02 361/127 |
| 2014/0340353 | A1* | 11/2014 | Chen .................... | H03K 17/962 345/174 |
| 2015/0123938 | A1* | 5/2015 | Gecnuk ................ | H03K 17/943 345/174 |
| 2017/0278650 | A1* | 9/2017 | Chen ..................... | G06F 1/1616 |
| 2018/0348889 | A1* | 12/2018 | Nishimura ............. | H03M 11/10 |
| 2019/0060746 | A1* | 2/2019 | Ironmonger ............ | A63F 13/24 |

* cited by examiner

*Primary Examiner* — Kevin M Nguyen
(74) *Attorney, Agent, or Firm* — Fenwick & West LLP

(57) ABSTRACT

A capacitive sensing assembly comprises a nonconductive interface material, a conductive plastic, an electrode, and a controller. The capacitive sensing assembly is configured to detect a proximity of skin to the nonconductive interface material. The nonconductive interface material comprises a first surface and a second surface that are opposite one another. The first surface receives contact with the skin. The conductive plastic is coupled to the second surface of the interface material. The electrode is electrically coupled to the conductive plastic and configured to provide an electrical signal. The electrical signal corresponds to a surface capacitance of the nonconductive interface material that is based in part on the conductive plastic, the nonconductive interface material, and the proximity of the skin to the interface material. The controller determines the proximity of the skin based on the electrical signal that corresponds to the surface capacitance.

18 Claims, 9 Drawing Sheets

CAPACITIVE SENSING ASSEMBLY FOR DETECTING PROXIMITY OF USER TO A CONTROLLER DEVICE

BACKGROUND

This disclosure relates generally to a controller device for receiving user input, and specifically to a capacitive sensing assembly for detecting proximity to a controller device.

Controller devices in an artificial reality system often include input features (e.g. buttons, thumb sticks, triggers, etc.). Some controller devices utilize a capacitive sensing assembly for detecting a proximity of a user's skin. Conventional capacitive sensing assemblies typically comprise a nonconductive interface layer and a metal layer that aids in measuring a surface capacitance of the nonconductive layer that is influenced by proximity of a user's skin. However, the process of forming the metal layer onto various nonconductive interface shapes with various contours is a challenging endeavor. The controller devices also include features for tracking positions or movements of the controller devices which may include utilizing locators, position sensors, and inertial measurement units (IMUs). The controller devices may additionally include feedback features such as through a haptic feedback assembly.

SUMMARY

A controller device comprises a capacitive sensing assembly configured to detect a proximity of a user's skin to the controller device. The controller device may be a component of an artificial reality system. In some embodiments, the capacitive sensing assembly is configured as any combination of a button assembly, a trigger assembly, and a thumb stick assembly. The button assembly may include multiple buttons configured to receive inputs through depression of the buttons. The trigger assembly may include multiple triggers configured to receive inputs through depression of the triggers. The thumb stick assembly may include multiple thumb sticks configured to receive inputs through either depression of the thumb sticks or lateral rotation of the thumb sticks. The capacitive sensing assembly detects a proximity of a user to the capacitive sensing assembly. The capacitive sensing assembly comprises a nonconductive interface material, a conductive plastic, an electrode, and a controller. The nonconductive interface material has a first surface and a second surface that are opposite one another. The first surface is configured to receive contact with skin of a user. The conductive plastic is coupled to the second surface of the nonconductive interface material. The electrode is coupled to the conductive plastic and configured to provide an electrical signal corresponding to a surface capacitance of the nonconductive interface material. The surface capacitance is based in part on the conductive plastic, the nonconductive interface material, and a proximity of the user's skin to the first surface of the nonconductive interface material. The controller is electrically coupled to the electrode and configured to determine the proximity of the user's skin based on the electrical signal received from the electrode corresponding to the surface capacitance of the nonconductive interface material.

Figure 1A:
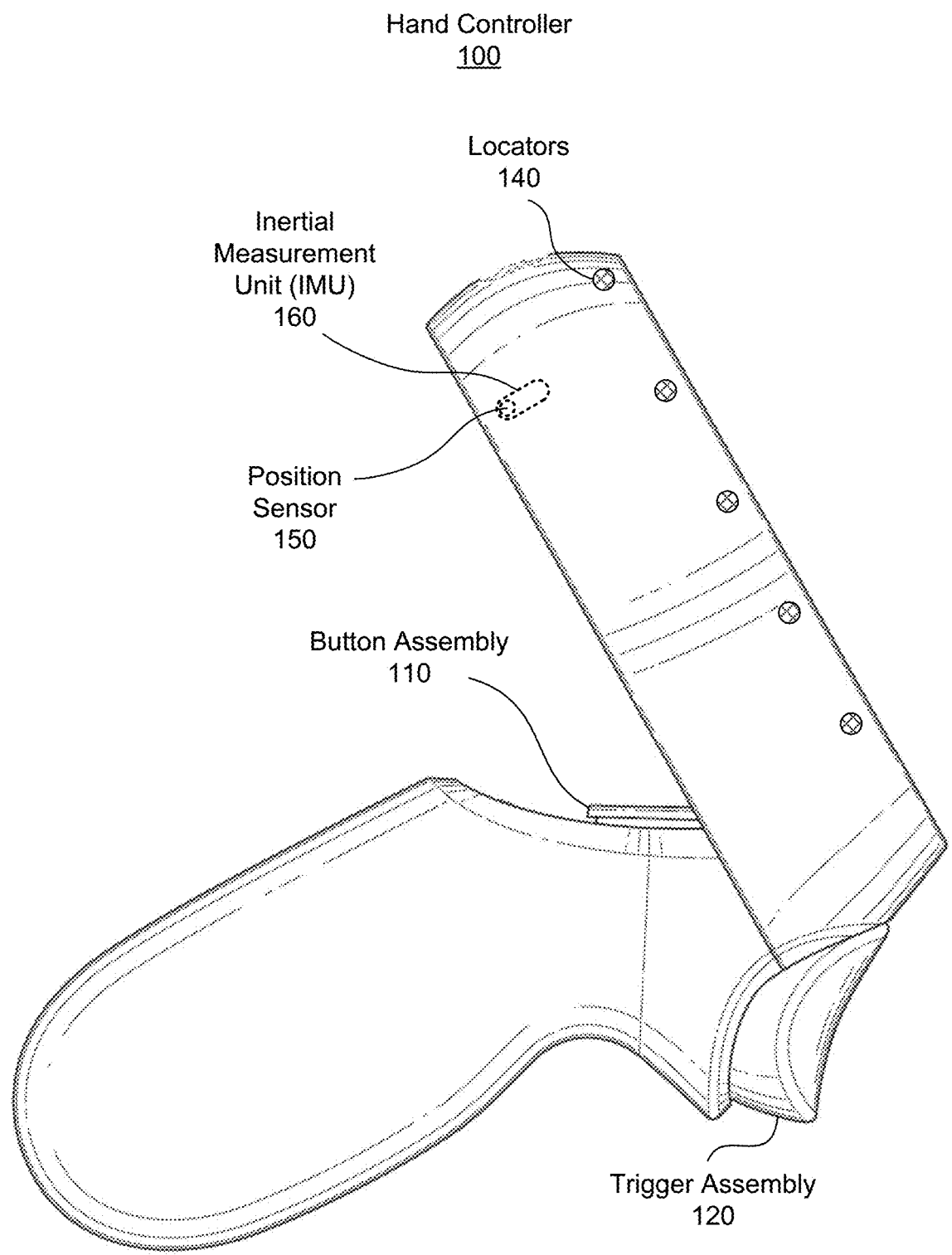
FIG. 1A is a side view of a hand controller, in accordance with one or more embodiments.

The figures depict embodiments of the present disclosure for purposes of illustration only. One skilled in the art will readily recognize from the following description that alternative embodiments of the structures and methods illustrated herein may be employed without departing from the principles, or benefits touted, of the disclosure described herein.

DETAILED DESCRIPTION

Embodiments of the invention may include or be implemented in conjunction with an artificial reality system. Artificial reality is a form of reality that has been adjusted in some manner before presentation to a user, which may include, e.g., a virtual reality, an augmented reality, a mixed reality, a hybrid reality, or some combination and/or derivatives thereof. Artificial reality content may include completely generated content or generated content combined with captured (e.g., real-world) content. The artificial reality content may include video, audio, haptic sensation, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including an eyewear device, a head-mounted display (HMD) assembly with the eyewear device as a component, a HMD connected to a host computer system, a standalone HMD, a mobile device or computing system, or any other hardware platform capable of providing artificial reality content to one or more viewers. In addition, the artificial reality system may implement multiple controller devices for receiving user input which may influence the artificial reality content provided to the user.

System Architecture

A capacitive sensing assembly detects proximity of a user's skin. The detected proximity of the user's skin may be described as a distance from the capacitive sensing assembly with some instances including contact of the capacitive sensing assembly. In some embodiments, the capacitive sensing assembly may be configured as a button assembly, a trigger assembly, a thumb stick assembly, some other assembly that detects proximity of a user's skin, or some combination thereof. The capacitive sensing assembly comprises a nonconductive interface material, a conductive plastic, an electrode, and a controller. The nonconductive interface material has a first surface and a second surface that are opposite one another. The first surface is configured to receive contact with skin of a user. In embodiments where the capacitive sensing assembly is integrated with the input assembly, the nonconductive interface material corresponds to a surface of the input assembly that is configured to receive contact with the user's skin. The conductive plastic is coupled to the second surface of the nonconductive interface material. The conductive plastic can be lightweight and easily formed to the nonconductive interface material. In some embodiments, the conductive plastic is an organic polymer that is also more cost effective compared to forming a metal layer to the nonconductive interface material.

In conventional capacitive sensors conductive plastics are not used due to their low conductivity relative to metals. However, accounting for the lower conductivity, the conductive plastics have a number of advantages that facilitate use in a capacitive sensing assembly. First in contrast to conventional systems that use conductive metals (instead of a conductive plastic) the conductive plastic can easily be formed to fit different geometries. Moreover, there is greater control over conductivity (relative to a metal conductivity), as it can tailored by adjusting the composition of the conductive plastic. As a result, use of conductive plastics can simplify assembly and reduce the number of parts compared to existing technologies. Moreover, a wide variety of conductive plastics exist with a range of conductivity and method used to conduct electricity such as long conductive fibers, ground conductive fibers and conductive powder. These options create challenges to resolve for the particular application of capacitive sensing. Depending on the application, the surface area (skin side), contact area (electrode connection to printed circuit board), volume resistivity and surface resistivity are all parameters that need to be adjusted to create a plastic capacitive sensor.

Due to the significantly lower conductivity of conductive plastics compared to metals, it is not obvious that conductive plastic can function in a capacitive sensing system. Conductive plastic is not typically used in a traditional electric circuit. Conductive plastic is typically used for dissipating static charges (ESD) or as an electro-magnetic interference (EMI) shield. However, the electronics and integrated circuits have improved to allow for more sensitive measurements and calibration enabling conductive plastic to achieve the required capacitance.

The electrode is coupled to the conductive plastic and configured to provide an electrical signal corresponding to a surface capacitance of the nonconductive interface material. The surface capacitance is based in part on the conductive plastic, the nonconductive interface material, and a proximity of the user's skin to the first surface of the nonconductive interface material. The controller is electrically coupled to the electrode and configured to determine the proximity of the user's skin based on the electrical signal received from the electrode corresponding to the surface capacitance of the nonconductive interface material. In some embodiments, the proximity detected by the controller can be determined by the electrical signal corresponding to the surface capacitance being below a threshold capacitance.

FIG. 1A is a side view of a hand controller 100, in accordance with one or more embodiments. The hand controller 100 is an embodiment of a controller device containing a capacitive sensing assembly. The hand controller 100 includes a capacitive sensing assembly. According to one embodiment, the capacitive sensing assembly may be configured to be a button assembly 110, a trigger assembly 120, or a combination thereof. In other embodiments, the hand controller 100 comprises multiple capacitive sensing assemblies with each configured to detect proximity for one or more sources (e.g., one or more buttons, one or more triggers, one or more thumb sticks, etc.). The hand controller 100 additionally has one or more locators 140, a position sensor 150, and an inertial measurement unit (IMU) 160. The button assembly 110 and the trigger assembly 120 are both configured to receive input from a user of the hand controller 100. In one embodiment, the hand controller 100 is a component of an artificial reality system. In other embodiments, the hand controller 100 contains additional components than those listed, e.g., the hand controller 100 has multiple capacitive sensing assemblies or the hand controller 100 has multiple position sensors 150 and multiple IMUs 160. In the embodiment of FIG. 1A, the hand controller 100 is configured to operate with one hand of the user; however, in other embodiments, a second hand controller with mirror symmetry in relation to the hand controller 100 may be configured to operate with the other hand of the user.

The button assembly 110 contains one or more buttons that each receive input when at least partially depressed. Each button of the button assembly 110 translates along one or more axes. In some embodiments, a button translates along a single axis. Translation of a button along the one or more axes may correspond to various inputs. In one embodiment, a button only receives an input when the button is depressed by a threshold distance corresponding to a threshold translation of the button along an axis. At least one button of the one or more buttons is a capacitive sensor of the capacitive sensing assembly. As a user's skin approaches the button, the capacitive sensor senses a proximity of the user's skin to the button. The button assembly 110 may comprise a multitude of buttons each configured to receive one or more inputs. In one embodiment, the button assembly comprises one or more buttons configured as a directional pad (D-pad) with each button of the D-pad corresponding to a directional input. The button assembly 110 will be described in greater detail in conjunction with FIGS. 2A & 2B.

The trigger assembly 120 contains one or more triggers that each receive input when depressed. Each trigger of the trigger assembly 120 is fixed at a point providing rotational movement of the trigger about the fixed point. In one embodiment, a trigger only receives an input when the trigger is rotated more than some threshold degree. In another embodiment, a trigger may detect a range of angular rotation of the trigger. Each trigger is also a capacitive sensor of the capacitive sensing assembly capable of detecting a proximity of the user's skin to the trigger. The trigger assembly 120 will be described in greater detail in conjunction with FIGS. 3A & 3B.

The one or more locators 140 are objects located in specific positions on the hand controller 100. In some embodiments, each locator 140 may be placed above or below an exterior surface of the hand controller 100. Each locator 140 may be a light emitting diode (LED), a corner cube reflector, a reflective marker, a type of light source that contrasts with an environment in which the hand controller 100 operates, or some combination thereof. In embodiments where the locators 140 are active (i.e., an LED or other type of light emitting device), the locators 140 may emit light in the visible band (~380 nm to 750 nm), in the infrared (IR) band (~750 nm to 1 mm), in the ultraviolet band (10 nm to 380 nm), some other portion of the electromagnetic spectrum, or some combination thereof. In embodiments where the locators 140 are passive, the locators 140 may reflect light in the visible band (~380 nm to 750 nm), in the infrared (IR) band (~750 nm to 1 mm), in the ultraviolet band (10 nm to 380 nm), some other portion of the electromagnetic spectrum, or some combination thereof. The locators 140 will be described in greater detail in conjunction with FIG. 5.

The position sensor 150 generates one or more measurement signals in response to motion of the hand controller 100. The position sensor 150 may be located external to the IMU 160, internal to the IMU 160, or some combination thereof. The position sensor 150 will be described in greater detail in conjunction with FIG. 5.

The IMU 160 is an electronic device that generates IMU data. Based the measurement signals from the position sensor 150, the IMU 160 generates IMU data indicating an estimated position of the hand controller 100 relative to an initial position of the hand controller 100. The IMU 160 will be described in greater detail in conjunction with FIG. 5.

Figure 1B:
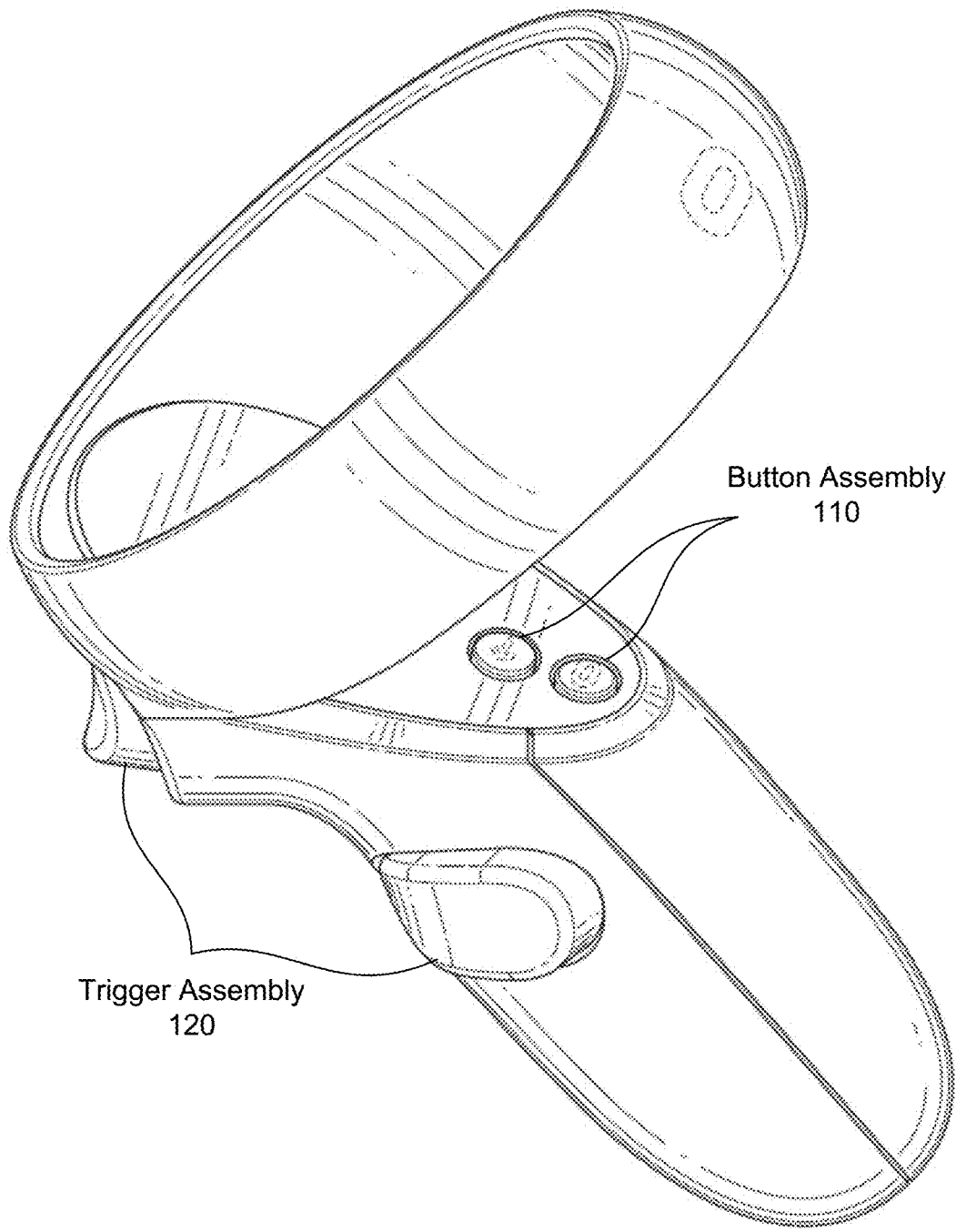
FIG. 1B is a perspective view of the hand controller of FIG. 1A, in accordance with one or more embodiments.

FIG. 1B is a perspective view of the hand controller 100 of FIG. 1A, in accordance with one or more embodiments. The hand controller 100 comprises one or more capacitive sensing assemblies. In one embodiment, the hand controller 100 has one capacitive sensing assembly configured to be a button assembly 110 and a trigger assembly 120. In another embodiment, the hand controller 100 has multiple capacitive sensing assemblies, wherein each capacitive sensing assembly may be configured to be one or more button assemblies 110, one or more trigger assemblies, or some combination thereof. The button assembly 110 and the trigger assembly 120 are both configured to receive input from a user of the hand controller 100.

Figure 2A:
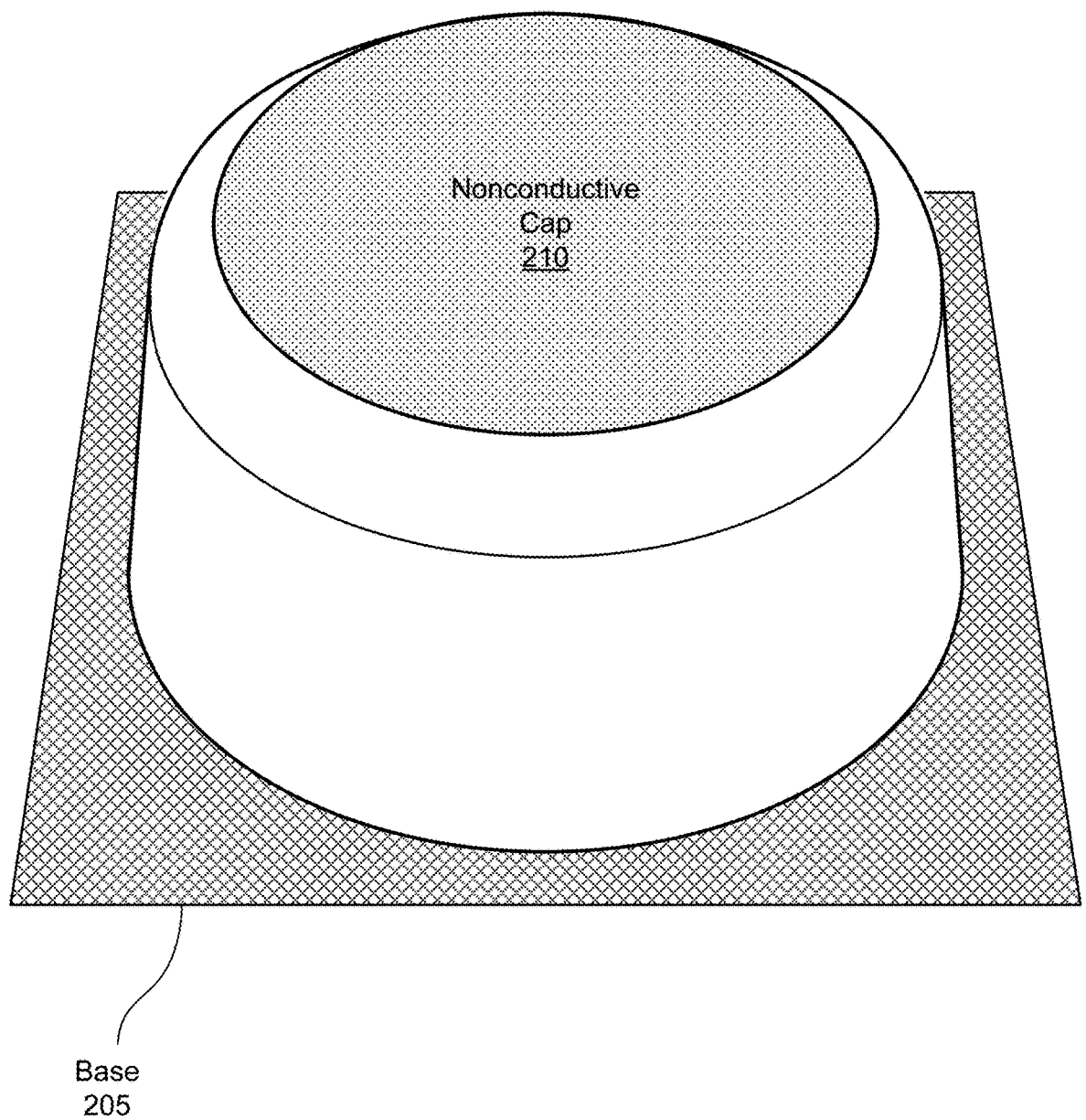
FIG. 2A is a perspective view of a button assembly, in accordance with one or more embodiments.

FIG. 2A is a perspective view of a button assembly 200, in accordance with one or more embodiments. The button assembly 200 may be an embodiment of the button assembly 110 in FIG. 1A. The button assembly 200 is an embodiment of a capacitive sensing assembly. In the perspective view of FIG. 2A, the button assembly 200 has a nonconductive cap 210 that is configured to be in contact with skin of the user. The button assembly 200 translates in relation to a base 205 which may be part of the hand controller 100. The base 205 is generally a printed circuit board. However, the base 205 could alternatively be some layer that the button assembly 200 couples to. As the user's skin approaches the nonconductive cap 210, the button assembly 200 may detect a proximity of the user's skin to the nonconductive cap 210. In some embodiments, the button assembly 200 may also detect a position where the user's skin is proximal to the button assembly 200.

Figure 2B:
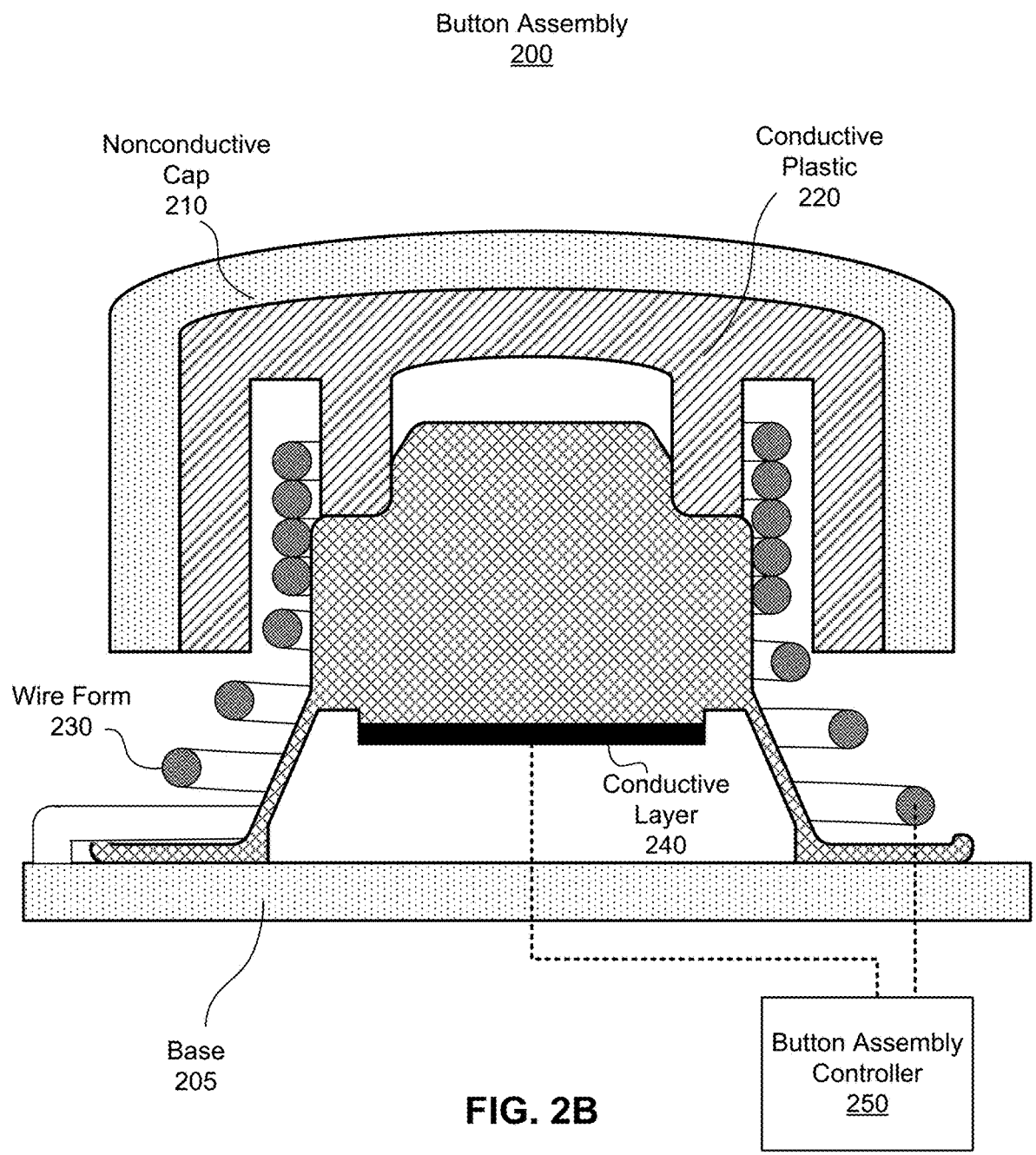
FIG. 2B is a cross sectional view of the button assembly of FIG. 2A, in accordance with one or more embodiments.

FIG. 2B is a cross sectional view of the button assembly 200 of FIG. 2A, in accordance with one or more embodiments. The button assembly 200 comprises the nonconductive cap 210, a conductive plastic 220, a wire form 230, a conductive layer 240, and a button assembly controller 250.

The nonconductive cap 210 is a nonconductive interface material that receives contact of the user's skin. The nonconductive cap 210 provides an interface with which the user may contact the button assembly 200. The nonconductive cap 210 may be composed of an insulating material, a semiconducting material, or a combination thereof. The nonconductive cap 210 may be shaped to have a uniform or a varying thickness all around. The nonconductive cap 210 may be composed of a rigid material (e.g., hard plastics), a flexible material (e.g., rubber, flexible polymer, etc.), or some combination thereof. The nonconductive cap 210 has an exterior surface and an interior surface. The user of the button assembly 200 contacts the exterior surface when pressing the button assembly 200. The interior surface is opposite that of the exterior surface and is inside the button assembly 200. The nonconductive cap 210 functions as an insulating layer, wherein the button assembly 200 measures a surface capacitance of the nonconductive cap 210. The surface capacitance of the nonconductive cap 210 is based on a proximity of the user's skin to the exterior surface of the nonconductive cap 210. As the user's skin (e.g. a finger) approaches the exterior surface of the nonconductive cap 210, the proximity of the user's skin to the exterior surface affects an amount of air between the user's skin and the nonconductive cap 210. The amount of air between the user's skin and the nonconductive cap 210 affects the surface capacitance of the nonconductive cap 210. Similarly, as the user's skin contacts the exterior surface of the nonconductive cap 210, a pressure applied by the user's skin to the nonconductive cap 210 and a contact area of the user's skin to the exterior surface of the nonconductive cap 210 may also affect the surface capacitance. Specifically in embodiments where the nonconductive cap 210 is a flexible material, as the user applies the pressure, the nonconductive cap 210 flexes changing the surface capacitance of the portion of the nonconductive cap 210 that flexes.

The conductive plastic 220 is coupled to the nonconductive cap 210. The conductive plastic 220 is composed of a conductive material, a semiconducting material, or a combination thereof. The conductive plastic 220 may be composed of an organic polymer that is conductive, e.g., polyaniline, polyacetylene, polypyrrole, polyindole, poly(p-phenylene vinylene), poly(3-alkythiophenes), etc. In embodiments not shown, what is illustrated in FIG. 2B as the conductive plastic 220 may be composed of conductive plastic coating on some other non-conductive material. The conductive plastic 220 can be lightweight due to its material composition. In some embodiments, the conductive plastic 220 is injection molded onto the nonconductive cap 210. Injection molding is a cost effective method that can precisely form the conductive plastic 220 to the nonconductive cap 210 over various potential shapes and potential contours of the nonconductive cap 210. Moreover, conductive plastic is a more cost effective material compared to metal. For example, the ability to easily form the conductive plastic into any geometry (relative to a metal) allows for a marked reduction in parts relative to a number of parts required if this were to be implemented using metal layers instead of conductive plastic 220. The conductive plastic 220 is more conductive than the nonconductive cap, e.g., the conductive plastic has a conductivity of at least $10^{-4}$ Siemens per meter. Conduction of electricity by the conductive plastic 220 is dependent on the surface capacitance of the nonconductive cap 210.

The wire form 230 is an electrode that is coupled to the conductive plastic 220. In this illustrative embodiment, the wire form 230 is formed as a coil contacting the conductive plastic 220 and a button assembly controller 250. The wire form 230 also contacts the base 205 (e.g., the printed circuit board). The wire form 230 is composed of a conductive material that can provide an electrical signal to the button assembly controller 250. In some embodiments, one or more portions of the wire form 230 is covered with an insulating material. The electrical signal corresponds to an amount of conduction by the conductive plastic 220 which is influenced by the surface capacitance of the nonconductive cap 210. In some embodiments, the wire form 230 comprises multiple electrodes coupled to specific locations of the conductive plastic 220. In these embodiments, an electrical signal can be conducted through any pair of electrodes corresponding to a pairwise surface capacitance of the nonconductive cap 210 between the two locations where the electrodes are placed. In these embodiments, a plurality of electrical signals between every combination of pairs of electrodes may be provided to the button assembly controller 250. The wire form 230 may also function as a spring providing a feedback force counteracting the force applied to pressing the button assembly 200.

The conductive layer 240 is a layer of conductive material that provides an electrical signal when the button assembly 200 is fully depressed. The conductive material may be, e.g., a metal, a conductive elastomer, a conductive plastic, or some combination thereof. In this embodiment, the conductive layer 240 is coupled to a bottom of the button assembly 200. As the user presses the button assembly 200, the conductive layer contacts the base 205. On the base 205 the button assembly 200 may have an open circuit which is then completed when the conductive layer 240 contacts either end of the open circuit. When the circuit is completed by the conductive layer 240, an electrical signal is provided to the button assembly controller 250 signaling a press of the button assembly 200. The conductive layer 240 may be composed of any conductive metal or other conductive material.

The button assembly controller 250 receives electrical signals from the wire form 230 and the conductive layer 240. The button assembly controller 250 is represented by a box with the dashed lines representing electrical connections between the button assembly controller 250 and other components of the button assembly 200. The button assembly controller 250 determines a proximity of the user's skin to the nonconductive cap 210 based on the electrical signal received from the wire form 230. In one embodiment, the wire form 230 provides an electrical signal based on the surface capacitance of the nonconductive cap 210 and the conductivity of the conductive plastic 220. As the surface capacitance of the nonconductive cap 210 depends on a proximity of the user's skin to the nonconductive cap 210, the button assembly controller 250 determines the proximity of the user's skin to the nonconductive cap 210 by measuring a change in the surface capacitance as the user's skin draws near to or in contact with the nonconductive cap 210. When the user's skin contacts the nonconductive cap 210, the button assembly controller 250 may also determine a force applied to the nonconductive cap 210, a contact area of the user's skin to the nonconductive cap 210, or a combination thereof. In some embodiments, the button assembly controller 250 may determine whether the user's skin has contacted the nonconductive cap 210 based on a measured surface capacitance being below some threshold for determining contact. Once that threshold is reached, the button assembly controller 250 may determine a force that depends on the surface capacitance that can be affected by applied force on the nonconductive cap 210. In some embodiments, the wire form 230 provides a plurality of electrical signals with each electrical signal corresponding to a pairwise surface capacitance of a portion of the nonconductive cap 210 between two electrodes of a plurality of electrodes comprising the wire form 230. In these embodiments, the button assembly controller 250 may determine a proximity map describing a proximity of the user's skin at each position of the nonconductive cap 210. In other embodiments, the button assembly controller 250 may determine a contact area by identifying portions of the proximity map where the surface capacitance is below the threshold for determining contact. Additionally, the button assembly controller 250 receives the electrical signal from the conductive layer 240 which indicates the button assembly 210 is fully pressed.

Figure 3A:
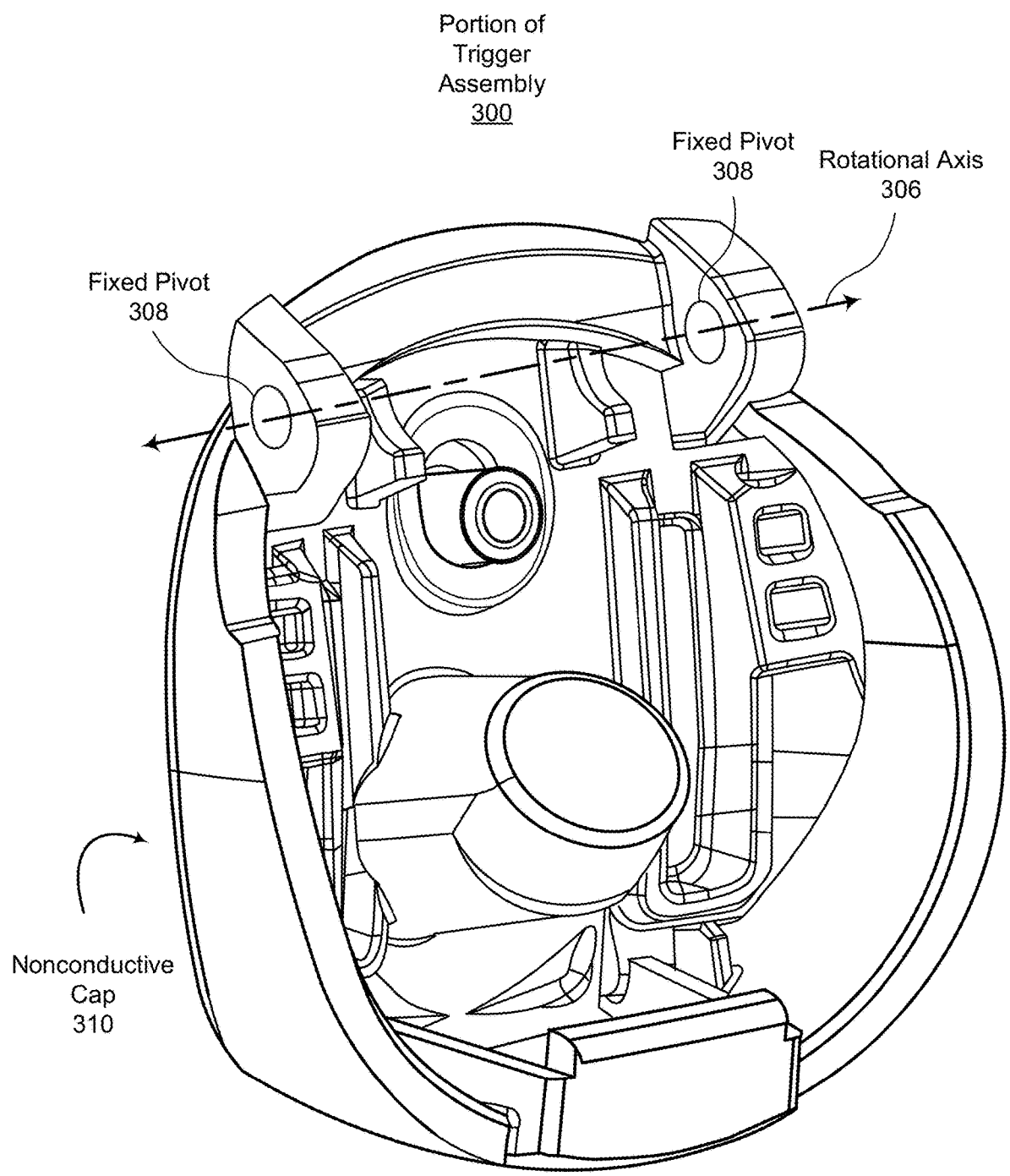
FIG. 3A is an interior view of a portion of a trigger assembly, in accordance with one or more embodiments.

FIG. 3A is an interior view of a portion of a trigger assembly 300, in accordance with one or more embodiments. The trigger assembly 300 may be an embodiment of the trigger assembly 120 in FIG. 1A. The trigger assembly 300 is an embodiment of a capacitive sensing assembly. In the interior view of FIG. 3A, the trigger assembly 300 has a nonconductive cap 310 that is configured to be in contact with the user's skin. The trigger assembly 300 rotates in relation to a rotational axis 306 which is determined by two fixed pivots 308. In some embodiments, an axle is placed through both fixed pivots 308. As a user of the trigger assembly 300 applies a force to the trigger assembly 300, the trigger assembly 300 rotates in relation to the rotational axis 306. The rotation of the trigger assembly 300 may be measured in addition to detecting a proximity of the user's skin to the trigger assembly 300.

Figure 3B:
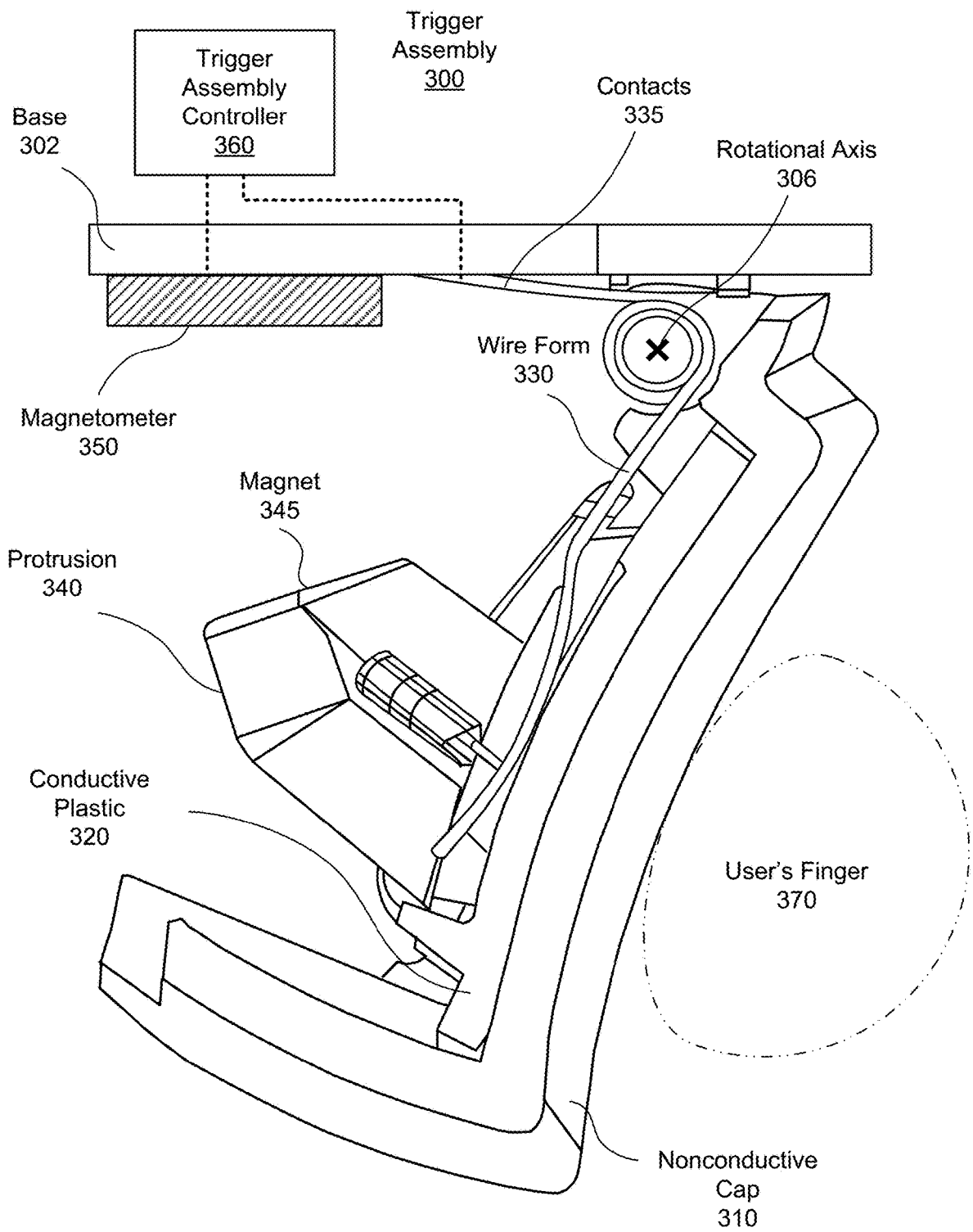
FIG. 3B is a cross sectional view of the trigger assembly of FIG. 3A, in accordance with one or more embodiments.

FIG. 3B is a cross sectional view of the trigger assembly 300 of FIG. 3A, in accordance with one or more embodiments. The trigger assembly 300 comprises the nonconductive cap 310, a conductive plastic 320, a wire form 330, a protrusion 340, a magnet 345, a magnetometer 350, and a trigger assembly controller 360. In other embodiments, the trigger assembly 300 may comprise various additional components. As a user of the trigger assembly 300 applies a force to the trigger assembly 300 (e.g., by a user's finger 370), the trigger assembly 300 rotates in relation to the rotational axis 306. The rotation of the trigger assembly 300 may be measured in addition to detecting a proximity of the user's skin (e.g., the user's finger 370) to the trigger assembly 300.

The nonconductive cap 310 is a nonconductive interface material that receives contact of the user's skin. The nonconductive cap 310 provides an interface with which the user may contact the trigger assembly 300. The nonconductive cap 310 may be composed of an insulating material, a semiconducting material, or a combination thereof. The nonconductive cap 310 may be composed of a rigid material (e.g., hard plastics), a flexible material (e.g., rubber, flexible polymer, etc.), or some combination thereof. The nonconductive cap 310 may be L-shaped or any other trigger shape. Similar to the nonconductive cap 210, the nonconductive cap 310 functions as an insulating layer. The trigger assembly 300 detects a proximity of the user's skin to the nonconductive cap 310 by measuring a surface capacitance of the nonconductive cap 310, wherein the surface capacitance of the nonconductive cap 310 is based on a proximity of the user's skin to an exterior surface of the nonconductive cap 310. When the user's skin contacts the exterior surface of the nonconductive cap 310 and begins to apply a pressure to the nonconductive cap 310, the applied pressure and a contact area of the user's skin to the exterior surface of the nonconductive cap 310 may also affect the surface capacitance. Specifically in embodiments where the nonconductive cap 310 is a flexible material, as the user applies the pressure, the nonconductive cap 310 flexes changing the surface capacitance of the portion of the nonconductive cap 310 that flexes.

The conductive plastic 320 is coupled to the nonconductive cap 310. The conductive plastic 320 may be composed of the same materials as the conductive plastic 220 with similar material properties as the conductive plastic 220. In embodiments not shown, what is illustrated in FIG. 3B as the conductive plastic 320 may be composed of conductive plastic coating on some other non-conductive material. The conductive plastic 320 can be lightweight due to its material composition. The conductive plastic 320 may as well be injection molded onto the nonconductive cap 310 similar to the conductive plastic 220. Injection molding is a cost effective method that can precisely form the conductive plastic 320 to the nonconductive cap 310 over various potential shapes and potential contours of the nonconductive cap 310. Moreover, conductive plastic is a more cost effective material when compared to using metal in conventional capacitive sensing assemblies. Conduction of electricity by the conductive plastic 320 is dependent on the surface capacitance of the nonconductive cap 310.

The wire form 330 is an electrode coupled to the conductive plastic 320 and a base 302 (via contacts 335). The base 302 is generally a printed circuit board. However, the base 302 could alternatively be some layer that portions of the trigger assembly 300 couples to. In this illustrative embodiment, the wire form 330 is formed as a latch spring contacting the conductive plastic 320 and a trigger assembly controller 360. The wire form 330 is composed of a conductive material that can provide an electrical signal to the trigger assembly controller 360. In some embodiments, one or more portions of the wire form 330 is covered with an insulating material. The electrical signal corresponds to an amount of conduction by the conductive plastic 320 which is influenced by the surface capacitance of the nonconductive cap 310. In some embodiments, the wire form 330 comprises multiple electrodes coupled to specific locations of the conductive plastic 320. In these embodiments, an electrical signal can be conducted through any pair of electrodes corresponding to a pairwise surface capacitance of the nonconductive cap 310 between the two locations where the electrodes are placed. In these embodiments, a plurality of electrical signals between every combination of pairs of electrodes may be provided to the trigger assembly controller 360. The wire form 330 also functions as a spring providing a feedback force counteracting the force applied to pressing the trigger assembly 300. As the user applies a force to press the trigger assembly 300 which rotates the trigger assembly 300 about the rotational axis 306 towards the base 302 (part of the hand controller 100), the wire form 330 provides a feedback force that seeks to rotate the trigger assembly 300 about the rotational axis 306 away from the base 302.

In one embodiment, the protrusion 340 holds the magnet 345 for detecting rotation of the trigger assembly 300 by the magnetometer 350. The protrusion 340 is placed on an interior surface of the nonconductive cap 310. The magnet 345 is coupled to the protrusion 340 and provides a magnetic field. The magnetometer 350 is coupled to the base 302 and measures a magnetic signal based on strength of a magnetic field. As the trigger assembly 300 rotates about the rotational axis 306, a distance between the magnet 345 and the magnetometer 350 changes. The distance between the magnet 345 and the magnetometer 350 affects the strength of the magnetic signal measured by the magnetometer 350. The magnetometer 350 provides the magnetic signal to the trigger assembly controller 360. In some embodiments, the magnetometer 350 is an electromagnet that converts a magnetic field into an electrical signal that is then provided to the trigger assembly controller 360. Additionally, the protrusion 340 provides a rotational range of the trigger assembly 300. A distance between the protrusion 340 and the base 302 (or the magnetometer 350) effectively sets the rotational range from a resting position of the trigger assembly 300. In other embodiments, the protrusion 340 may be configured to detect rotation of the trigger assembly 300 with an optical sensor (not shown). The protrusion 340 may have a reflective portion which can be used with the optical sensor for detecting rotation.

The trigger assembly controller 360 receives one or more electrical signals from the wire form 330 and a magnetic signal from the magnetometer 350. The trigger assembly controller 360 is represented by a box with the dashed lines representing electrical connections between the trigger assembly controller 360 and other components of the trigger assembly 300. The trigger assembly controller 360 determines a proximity of the user's skin to the nonconductive cap 310 based on the one or more electrical signals received from the wire form 330. In one embodiment, the wire form 330 provides an electrical signal based on the surface capacitance of the nonconductive cap 310 and the conductivity of the conductive plastic 320. As the surface capacitance of the nonconductive cap 310 depends on a proximity of the user's skin to the nonconductive cap 310, the trigger assembly controller 360 determines the proximity of the user's skin to the nonconductive cap 310 by measuring a change in the surface capacitance as the user's skin draws near to or in contact with the nonconductive cap 310. When the user's skin contacts the nonconductive cap 310, the trigger assembly controller 360 may also determine a force applied to the nonconductive cap 310, a contact area of the user's skin to the nonconductive cap 310, or a combination thereof. In some embodiments, the trigger assembly controller 360 may determine whether the user's skin has contacted the nonconductive cap 310 based on a measured surface capacitance being below some threshold for determining contact. Once that threshold is reached, the trigger assembly controller 360 may determine a force that depends on the surface capacitance that can be affected by applied force on the nonconductive cap 310. In some embodiments, the wire form 330 provides a plurality of electrical signals with each electrical signal corresponding to a pairwise surface capacitance of a portion of the nonconductive cap 310 between two electrodes of a plurality of electrodes comprising the wire form 330. In these embodiments, the trigger assembly controller 360 may determine a proximity map describing a proximity of the user's skin at each position of the nonconductive cap 310. In other embodiments, the trigger assembly controller 360 may determine a contact area by identifying portions of the proximity map where the surface capacitance is below the threshold for determining contact. Additionally, the trigger assembly controller 360 receives the magnetic signal from the magnetometer 350 which is used to determine a rotation degree of the trigger assembly 300.

Figure 4A:
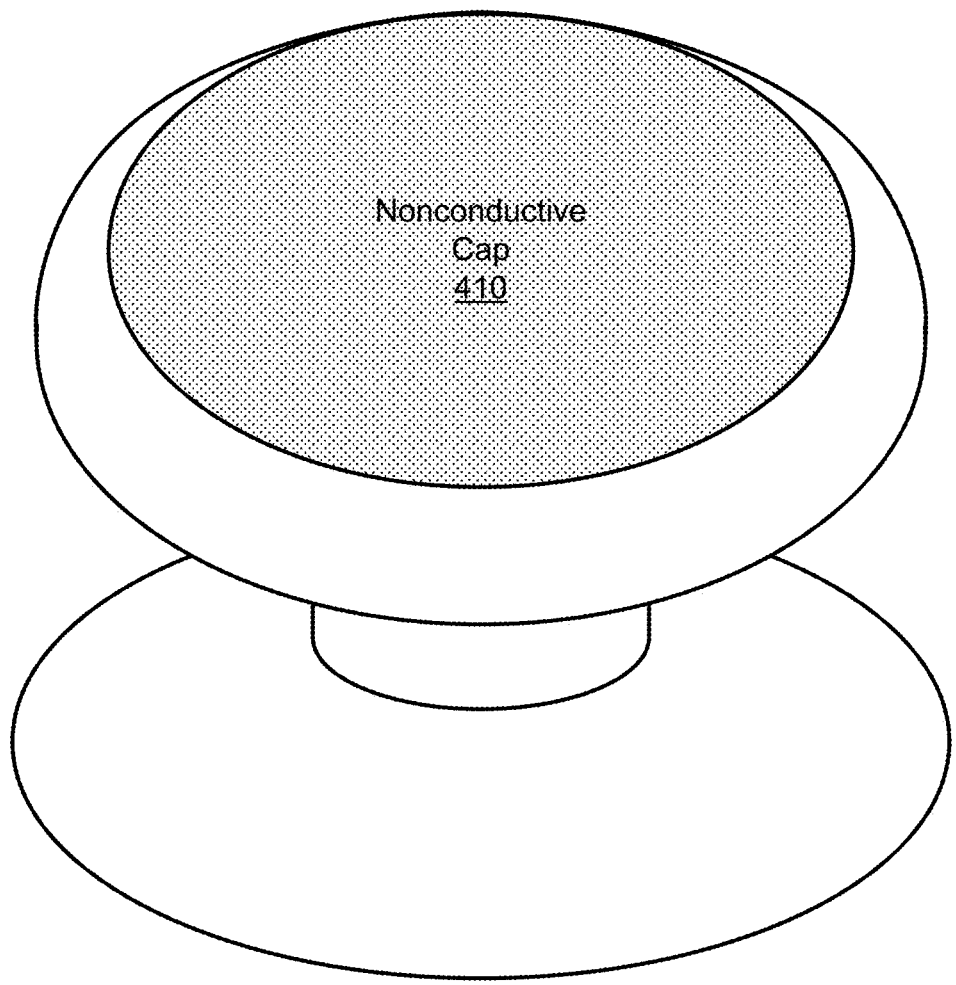
FIG. 4A is a perspective view of a thumb stick assembly, in accordance with one or more embodiments.

FIG. 4A is a perspective view of a thumb stick assembly 400, in accordance with one or more embodiments. The thumb stick assembly 400 is an embodiment of a capacitive sensing assembly. In the perspective view of FIG. 4A, the thumb stick assembly 400 has a nonconductive cap 410 that is configured to be in contact with skin of the user. The thumb stick assembly 400 rotates about a pivot which may be measured by the thumb stick assembly 400. As the user's skin approaches the nonconductive cap 410, the thumb stick assembly 400 may detect a proximity of the user's skin to the nonconductive cap 410 in a similar fashion as described above in regards to the button assembly 200 and the trigger assembly 300.

Figure 4B:
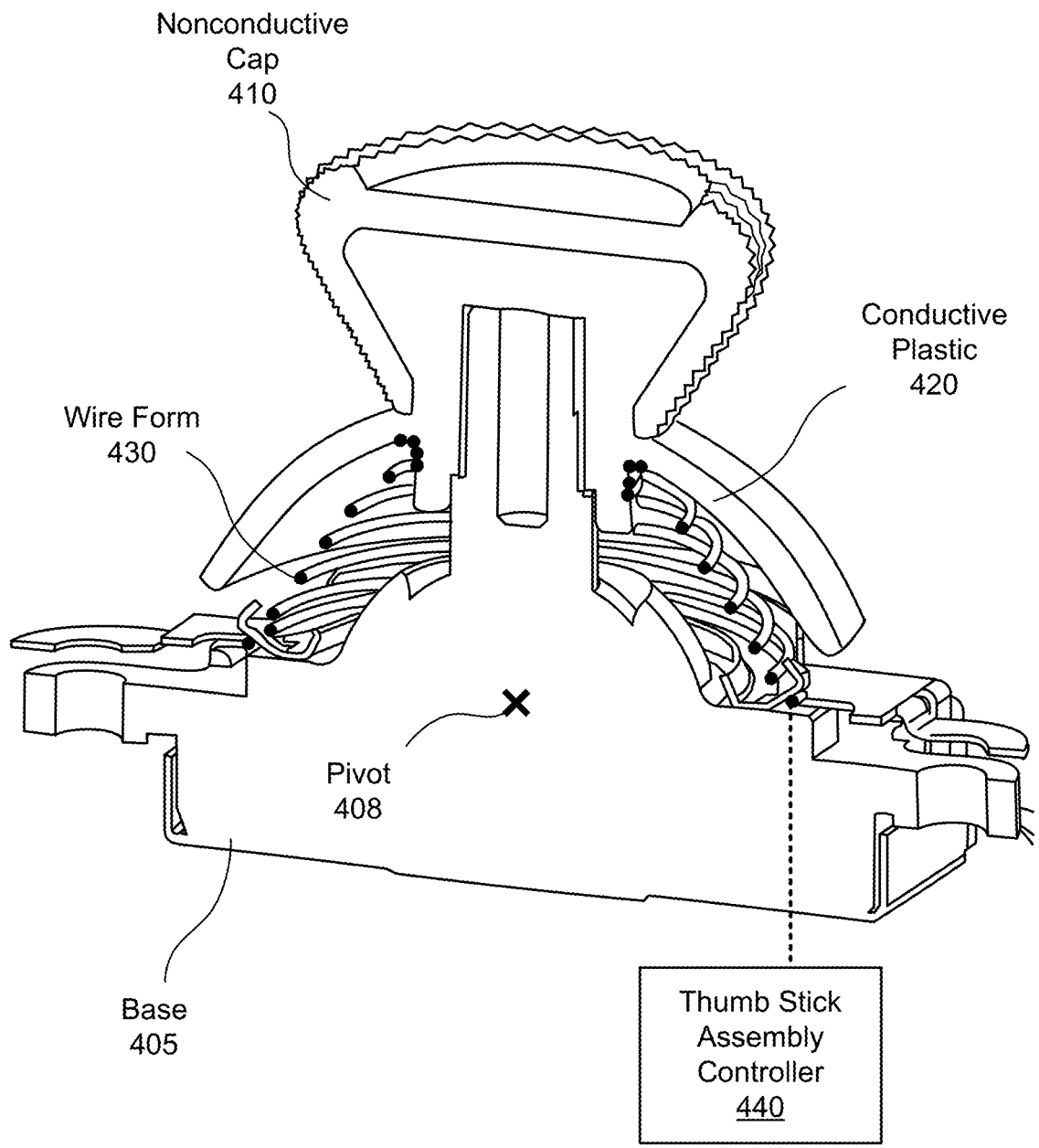
FIG. 4B is a cross sectional view of the thumb stick assembly of FIG. 4A, in accordance with one or more embodiments.

FIG. 4B is a cross sectional view of the thumb stick assembly 400 of FIG. 4A, in accordance with one or more embodiments. The thumb stick assembly 400 comprises a base 405 (e.g., a printed circuit board), the nonconductive cap 410, a conductive plastic 420, a wire form 430, and a trigger assembly controller 440. The thumb stick assembly controller 440 is represented by a box with dashed line representing an electrical connection between the thumb stick assembly controller 440 to the wire form 430. The thumb stick assembly 400 rotates about a pivot 408 which may be measured by the thumb stick assembly controller 440. The base 405, the nonconductive cap 410, the conductive plastic 420, and the wire form 430 are embodiments of the base 205, the nonconductive cap 210, the conductive plastic 220, and the wire form 230. In embodiments not shown, what is illustrated in FIG. 4B as the conductive plastic 420 may be composed of conductive plastic coating on some other non-conductive material. Similar to the conductive plastic 220, the conductive plastic 420 can be lightweight due to its material composition (e.g., conductive organic polymers). The conductive plastic 420 may also be injection molded onto the nonconductive cap 410 similar to the conductive plastic 220. Injection molding is a cost effective method that can precisely form the conductive plastic 420 to the nonconductive cap 410 over various potential shapes and potential contours of the nonconductive cap 410. Moreover, conductive plastic used for the conductive plastic 420 is a more cost effective material when compared to using metal in conventional capacitive sensing assemblies. For example, the ability to easily form the conductive plastic into any geometry (relative to a metal) allows for a marked reduction in parts relative to a number of parts required if this was implemented using metal layers instead of a conductive plastic 420.

The thumb stick assembly controller 440 determines a proximity of the user's skin to the nonconductive cap 410 based on the electrical signal received from the wire form 430. In one embodiment, the wire form 430 provides an electrical signal based on the surface capacitance of the nonconductive cap 410 and the conductivity of the conductive plastic 420. As the surface capacitance of the nonconductive cap 410 depends on a proximity of the user's skin to the nonconductive cap 410, the thumb stick assembly controller 440 determines the proximity of the user's skin to the nonconductive cap 410 by measuring a change in the surface capacitance as the user's skin draws near to or in contact with the nonconductive cap 410. In a similar fashion as described above for the button assembly controller 250, the thumb stick assembly controller 440 may additionally determine a force applied to the thumb stick assembly 300 by the user's skin and/or a contact area of the user's skin to the thumb stick assembly 300. In addition to detecting the proximity of the user's skin to the nonconductive cap 410, the thumb stick assembly controller 440 may also determine a degree of rotation of the thumb stick assembly 400.

Figure 5:
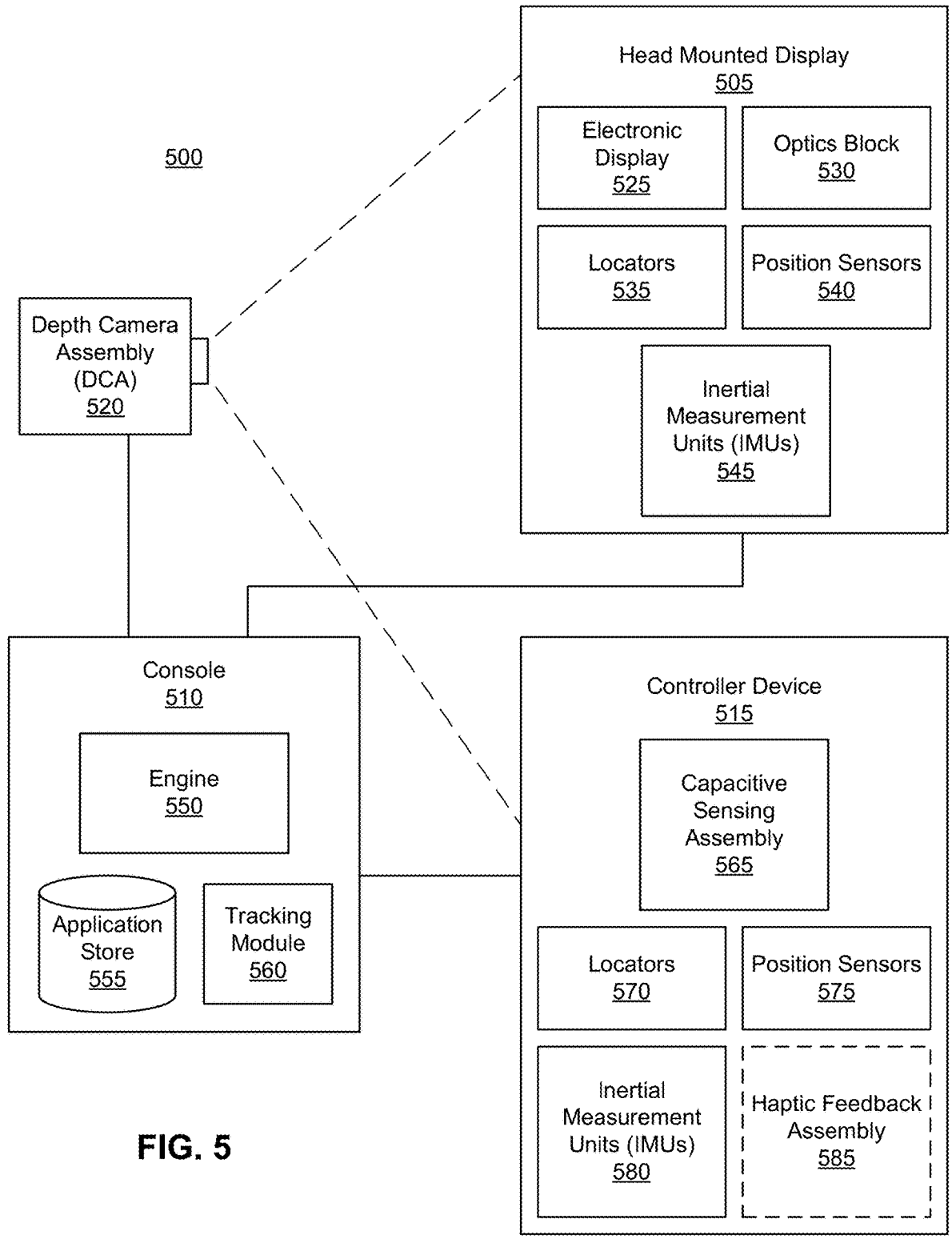
FIG. 5 is a system environment of a controller device in an artificial reality system, in accordance with one or more embodiments.

FIG. 5 is a system environment of a controller device 515 in an artificial reality system 500, in accordance with one or more embodiments. The artificial reality system 500 may operate in an artificial reality environment, e.g., a virtual reality, an augmented reality, a mixed reality environment, or some combination thereof. The artificial reality system 500 shown by FIG. 5 comprises a head-mounted display (HMD) 505, a controller device 515, and a depth camera assembly (DCA) 520 that is coupled to a console 510. While FIG. 5 shows an example artificial reality system 500 including one HMD 505 and one controller device 515, in other embodiments, any number of these components may be included in the artificial reality system 500. For example, there may be multiple HMD 505 each having an associated controller device 515 with each HMD 505 and controller device 515 communicating with the console 510. In alternative configurations, different and/or additional components may be included in the artificial reality system 500. Additionally, functionality described in conjunction with one or more of the components shown in FIG. 5 may be distributed among the components in a different manner than described in conjunction with FIG. 5 in some embodiments. For example, some or all of the functionality of the console 510 is provided by the HMD 505.

The HMD 505 may be a HMD that presents content to a user comprising augmented views of a physical, real-world environment with computer-generated elements (e.g., two dimensional (2D) or three dimensional (3D) images, 2D or 3D video, sound, etc.). In some embodiments, the HMD 505 presents virtual content to the user that is based in part on a real environment surrounding the user. For example, virtual content may be presented to a user of the HMD 505. The user physically may be in a room, and virtual walls and a virtual floor of the room are rendered as part of the virtual content.

The HMD 505 may include an electronic display 525, an optics block 530, one or more locators 535, one or more position sensors 540, and one or more inertial measurement units (IMUs) 545. Some embodiments of the HMD 505 have different components than those described in conjunction with FIG. 5. Additionally, the functionality provided by various components described in conjunction with FIG. 5 may be differently distributed among the components of the HMD 505 in other embodiments, or be captured in separate assemblies remote from the HMD 505.

The electronic display 525 displays 2D or 3D images to the user in accordance with data received from the console 510. In various embodiments, the electronic display 525 comprises a single electronic display or multiple electronic displays (e.g., a display for each eye of a user). Examples of the electronic display 525 include: a liquid crystal display (LCD), an organic light emitting diode (OLED) display, an active-matrix organic light-emitting diode display (AMOLED), some other display, or some combination thereof.

The optics block 530 magnifies image light received from the electronic display 525, corrects optical errors associated with the image light, and presents the corrected image light to a user of the HMD 505. In various embodiments, the optics block 530 includes one or more optical elements. Example optical elements included in the optics block 530 include: a waveguide, an aperture, a Fresnel lens, a convex lens, a concave lens, a filter, a reflecting surface, or any other suitable optical element that affects image light. Moreover, the optics block 530 may include combinations of different optical elements. In some embodiments, one or more of the optical elements in the optics block 530 may have one or more coatings, such as partially reflective or anti-reflective coatings.

The locators 535 are objects located in specific positions on the HMD 505 relative to one another. A locator 535 may be a light emitting diode (LED), a corner cube reflector, a reflective marker, a type of light source that contrasts with an environment in which the HMD 505 operates, or some combination thereof. In embodiments where the locators 535 are active (i.e., an LED or other type of light emitting device), the locators 535 may emit light in the visible band (~380 nm to 750 nm), in the infrared (IR) band (~750 nm to 1 mm), in the ultraviolet (UV) band (10 nm to 380 nm), some other portion of the electromagnetic spectrum, or some combination thereof. In other embodiments, the locators 535 include passive elements (e.g., a retroreflector). In these embodiments, the locators 535 may reflect over various bands of lights or over a specific band of light (e.g., visible band, IR band, UV band, etc.).

The IMUs 545 are electronic devices that generate data indicating a position of the HMD 505 based on measurement signals received from one or more of the position sensors 540. A position sensor 540 generates one or more measurement signals in response to motion of the HMD 505. Examples of position sensors 540 include: one or more accelerometers, one or more gyroscopes, one or more magnetometers, another suitable type of sensor that detects motion, a type of sensor used for error correction of the IMUs 545, or some combination thereof. The position sensors 540 may be located external to the IMUs 545, internal to the IMUs 545, or some combination thereof.

Based on the one or more measurement signals from one or more position sensors 540, the IMUs 545 generate data indicating an estimated current position of the HMD 505 relative to an initial position of the HMD 505. For example, the position sensors 540 include multiple accelerometers to measure translational motion (forward/back, up/down, left/right) and multiple gyroscopes to measure rotational motion (e.g., pitch, yaw, and roll). In some embodiments, the IMUs 545 rapidly sample the measurement signals and calculates the estimated current position of the HMD 505 from the sampled data. For example, the IMUs 545 integrate the measurement signals received from the accelerometers over time to estimate a velocity vector and integrate the velocity vector over time to determine an estimated current position of a reference point on the HMD 505. Alternatively, the IMUs 545 provide the sampled measurement signals to the console 510, which interprets the data to reduce error. The reference point is a point that may be used to describe the position of the HMD 505. The reference point may generally be defined as a point in space or a position related to the HMD's 505 orientation and position.

The controller device 515 is a device that allows a user to send action requests and receive responses from the console 510. An action request is a request to perform a particular action. For example, an action request may be an instruction to start or end capture of image or video data, or an instruction to perform a particular action within an application. In some embodiments, the controller device 515 comprises one or more capacitive sensing assemblies 565, one or more locators 570, one or more position sensors 575, and one or more IMUs 580. The hand controller 100 is one embodiment of the controller device 515.

The capacitive sensing assembly 565 detects a proximity of the user's skin to the capacitive sensing controller device 515. The capacitive sensing assembly 565 comprises a nonconductive cap, a conductive plastic, and an electrode. The nonconductive cap has a surface capacitance that is influenced by the proximity of the user's skin to the nonconductive cap. The conductive plastic is coupled to the nonconductive cap and the conductive plastic's ability to conduct electricity is influenced by the surface capacitance of the nonconductive cap. The conductive plastic can be lightweight due to its material composition (e.g., conductive organic polymers). The conductive plastic may also be injection molded onto the nonconductive cap. Injection molding is a cost effective method that can precisely form the conductive plastic to the nonconductive cap over various potential shapes and potential contours of the nonconductive cap. Moreover, conductive plastic used for the conductive plastic is a more cost effective material when compared to using metal in conventional capacitive sensing assemblies. The electrode transmits an electrical signal based on the conductivity of the conductive plastic which can be used to determine the proximity of the user's skin to the nonconductive cap. In some embodiments, the capacitive sensing assembly 565 is configured to operate as a button assembly (e.g., the button assembly 110 of FIG. 1A or the button assembly 200 of FIGS. 2A & 2B), a trigger assembly (e.g., the trigger assembly 120 of FIG. 1A or the trigger assembly 300 of FIGS. 3A & 3B), a thumb stick assembly (e.g., thumb stick assembly 400 of FIGS. 4A & 4B), or a combination thereof.

The proximity of the user's skin to the capacitive sensing assembly 565 may comprise the action request communicated to the console 510. In embodiments where the capacitive sensing assembly 565 is configured to operate as a button assembly, a trigger assembly, or a thumb stick assembly, the capacitive sensing assembly 565 may receive other action requests. The one or more action requests received by the controller device 515 is communicated to the console 510, which performs one or more actions corresponding to the action requests. The locators 570, the position sensors 575, and the IMUs 580 are embodiments of the locators 535, the position sensors 540, and the IMUs 545.

In some embodiments, the controller device 515 further comprises a haptic feedback assembly 585 for providing haptic feedback to the user of the artificial reality system 500. In some embodiments, the haptic feedback assembly 585 may provide haptic feedback to the user in accordance with instructions received from the console 510. For example, haptic feedback is provided when an action request is received, or the console 510 communicates instructions to the controller device 515 causing the controller device 515 to generate haptic feedback when the console 510 performs an action.

The depth camera assembly (DCA) 520 captures data describing depth information of a local area surrounding some or all of the HMD 505 and the controller device 515. In one embodiment, the DCA 520 includes a light generator, an imaging device, and a DCA controller that may be coupled to both the light generator and the imaging device. The light generator illuminates a local area with illumination light, e.g., in accordance with emission instructions generated by the DCA controller. The DCA controller is configured to control, based on the emission instructions, operation of certain components of the light generator, e.g., to adjust an intensity and a pattern of the illumination light illuminating the local area. In some embodiments, the illumination light may include a structured light pattern, e.g., dot pattern, line pattern, etc. The imaging device captures one or more images of one or more objects in the local area illuminated with the illumination light. In another embodiment, the DCA 520 includes an imaging device to capture positions of the locators 535 associated with the HMD 505 and the locators 570 of the controller device 515. The imaging device is configured to detect light emitted or reflected from locators 535 and 570 in a field of view of the imaging device. In embodiments where the locators 535 and 570 include passive elements (e.g., a retroreflector), the DCA 520 includes a light source that illuminates some or all of the locators 535 and 570, which retro-reflect the light towards the light source in the imaging device. The DCA 520 can compute the depth information using the data captured by the imaging device or the DCA 520 can send this information to another device such as the console 510 that can determine the depth information using the data from the DCA 520. In additional embodiments, the DCA 520 may be integrated as part of the HMD 505 capturing depth information of the controller device 515 or other components in relation to a position of the HMD 505.

The console 510 provides content to the HMD 505 for processing in accordance with information received from one or more of: the HMD 505 and the controller device 515. In the example shown in FIG. 5, the console 510 includes an application store 555, a tracking module 560 and an engine 550. Some embodiments of the console 510 have different modules or components than those described in conjunction with FIG. 5. Similarly, the functions further described below may be distributed among components of the console 510 in a different manner than described in conjunction with FIG. 5.

The application store 555 stores one or more applications for execution by the console 510. An application is a group of instructions, that when executed by a processor, generates content for presentation to the user. Content generated by an application may be in response to inputs received from the user via movement of the HMD 505 or the controller device 515. Examples of applications include: gaming applications, conferencing applications, video playback applications, or other suitable applications.

The tracking module 560 calibrates the system environment 500 using one or more calibration parameters and may adjust one or more calibration parameters to reduce error in determination of the position of the HMD 505 or of the controller device 515. Calibration performed by the tracking module 560 also accounts for information received from the IMUs 545 in the HMD 505 and/or IMUs 545 included in the controller device 515. Additionally, if tracking of the HMD 505 is lost, the tracking module 560 may re-calibrate some or all of the system environment 500.

The tracking module 560 tracks movements of the HMD 505, the controller device 515, or some combination thereof using information from the one or more position sensors 540, the IMUs 545, the DCA 520, or some combination thereof. For example, the tracking module 560 determines a position of a reference point of the HMD 505 in a mapping of a local area based on information from the HMD 505. The tracking module 560 may also determine positions of the reference point of the HMD 505 using data indicating a position of the HMD 505 from the IMUs 545. The tracking module 560 may determine positions of or a reference point of the controller device 515 using data indicating a position of the controller device 515 from IMUs 545 included in the controller device 515. Additionally, in some embodiments, the tracking module 560 may use portions of data indicating a position of the HMD 505 from the IMUs 545 to predict a future location of the HMD 505. The tracking module 560 provides the estimated or predicted future position of the HMD 505, the controller device 515, or both to the engine 550.

The engine 550 also executes applications within the system environment 500 and receives position information, acceleration information, velocity information, predicted future positions, or some combination thereof, of the HMD 505 from the tracking module 560. Based on the received information, the engine 550 determines content to provide to the HMD 505 for presentation to the user. For example, if the received information indicates that the user has looked to the left, the engine 550 generates content for the HMD 505 that mirrors the user's movement in a virtual environment or in an environment augmenting the local area with additional content. Additionally, the engine 550 performs an action within an application executing on the console 510 in response to an action request received from the controller device 515 and provides feedback to the user that the action was performed. The provided feedback may be visual or audible feedback via the HMD 505 or haptic feedback via the controller device 515.

Additional Configuration Information

The foregoing description of the embodiments of the disclosure has been presented for the purpose of illustration; it is not intended to be exhaustive or to limit the disclosure to the precise forms disclosed. Persons skilled in the relevant art can appreciate that many modifications and variations are possible in light of the above disclosure.

Some portions of this description describe the embodiments of the disclosure in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, hardware, or any combinations thereof.

Any of the steps, operations, or processes described herein may be performed or implemented with one or more hardware or software modules, alone or in combination with other devices. In one embodiment, a software module is implemented with a computer program product comprising a computer-readable medium containing computer program code, which can be executed by a computer processor for performing any or all of the steps, operations, or processes described.

Embodiments of the disclosure may also relate to an apparatus for performing the operations herein. This apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Embodiments of the disclosure may also relate to a product that is produced by a computing process described herein. Such a product may comprise information resulting from a computing process, where the information is stored on a non-transitory, tangible computer readable storage medium and may include any embodiment of a computer program product or other data combination described herein.

Finally, the language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the disclosure, which is set forth in the following claims.

What is claimed is:

1. A capacitive sensing assembly comprising:
   a nonconductive interface material comprising a first surface and a second surface that is opposite the first surface, the first surface configured to receive contact with skin of a user;
   a conductive plastic injection molded onto the second surface of the interface material;

an electrode electrically coupled to the conductive plastic and configured to provide an electrical signal that corresponds to a surface capacitance that is based in part on the conductive plastic, the nonconductive interface material, and proximity of the skin of the user to the first surface of the interface material; and a controller electrically coupled to the electrode and configured to determine a proximity of the skin of the user based on the electrical signal that corresponds to the surface capacitance.

2. The capacitive sensing assembly of claim 1, wherein the nonconductive interface material forms a button on a controller device.

3. The capacitive sensing assembly of claim 1, wherein the conductive plastic has a conductivity of at least $10^{-4}$ Siemens per meter.

4. The capacitive sensing assembly of claim 1, wherein the conductive plastic is an organic polymer that is conductive.

5. The capacitive sensing assembly of claim 4, wherein the organic polymer is comprised from a group consisting of: polyaniline, polyacetylene, polypyrrole, polyindole, poly(p-phenylene vinylene), poly(3-alkylthiophenes).

6. The capacitive sensing assembly of claim 1, wherein the electrode is formed as a coil.

7. The capacitive sensing assembly of claim 1, wherein the determined proximity of the skin of the user is a contact of the skin of the user to the first surface of the interface material.

8. The capacitive sensing assembly of claim 1, wherein the determined proximity of the skin of the user includes a first proximity and a second proximity, the first proximity corresponding to a first distance between a first portion of the skin and a first location on the interface material and the second proximity corresponding to a second distance between a second portion of the skin and a second location on the interface material.

9. The capacitive sensing assembly of claim 1, wherein the capacitive sensing assembly is part of a trigger of a trigger assembly of a controller device.

10. The capacitive sensing assembly of claim 9, wherein the nonconductive interface material further comprises a protrusion on the second surface, the capacitive sensing assembly further comprising:

a magnet coupled to the protrusion of the nonconductive interface material, wherein a proximity of the magnet to a second portion of the trigger assembly corresponds to a position of the trigger.

11. The capacitive sensing assembly of claim 1, wherein the capacitive sensing assembly forms a portion of a thumb stick on a controller device.

12. A controller device comprising:
a capacitive sensing assembly comprising:
  a nonconductive interface material comprising a first surface and a second surface that is opposite the first surface, the first surface configured to receive contact with the skin of the user;
  a conductive plastic injection molded onto the second surface of the interface material;
  an electrode electrically coupled to the conductive plastic and configured to provide an electrical signal that corresponds to a surface capacitance that is based in part on the conductive plastic, the nonconductive interface material, and proximity of the skin of the user to the first surface of the interface material; and
  a controller electrically coupled to the electrode and configured to determine the proximity of the skin of the user based on the electrical signal that corresponds to the surface capacitance.

13. The controller device of claim 12, wherein the nonconductive interface material forms a button on the controller device.

14. The controller device of claim 12, wherein the conductive plastic is an organic polymer that is conductive.

15. The controller device of claim 14, wherein the organic polymer is comprised from a group consisting of: polyaniline, polyacetylene, polypyrrole, polyindole, poly(p-phenylene vinylene), poly(3-alkylthiophenes).

16. The controller device of claim 12, wherein the electrode is formed as a coil.

17. The controller device of claim 12, wherein the determined proximity of the skin of the user is a contact of the skin of the user to the first surface of the interface material.

18. The controller device of claim 12, wherein the capacitive sensing assembly is part of a trigger of a trigger assembly of the controller device.

* * * * *